United States Patent
Toh et al.

(10) Patent No.: US 9,287,497 B2
(45) Date of Patent: Mar. 15, 2016

(54) INTEGRATED CIRCUITS WITH HALL EFFECT SENSORS AND METHODS FOR PRODUCING SUCH INTEGRATED CIRCUITS

(71) Applicant: GLOBALFOUNDRIES Singapore Pte. Ltd., Singapore (SG)

(72) Inventors: Eng Huat Toh, Singapore (SG); Xinfu Liu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/295,547

(22) Filed: Jun. 4, 2014

(65) Prior Publication Data
US 2015/0357561 A1    Dec. 10, 2015

(51) Int. Cl.
H01L 21/82    (2006.01)
H01L 43/14    (2006.01)
H01L 43/06    (2006.01)
H01L 43/04    (2006.01)

(52) U.S. Cl.
CPC ............... *H01L 43/14* (2013.01); *H01L 43/04* (2013.01); *H01L 43/065* (2013.01)

(58) Field of Classification Search
CPC .. H01L 27/0207; H01L 23/528; H01L 27/112
USPC .......................................... 257/211; 438/128
See application file for complete search history.

(56) References Cited

U.S. PATENT DOCUMENTS

| | | | |
|---|---|---|---|
| 8,445,356 B1* | 5/2013 | Cai et al. .................. | 438/427 |
| 2011/0193161 A1* | 8/2011 | Zhu et al. .................. | 257/343 |
| 2014/0117421 A1* | 5/2014 | Seo et al. .................. | 257/288 |
| 2014/0154857 A1* | 6/2014 | Tilke ....................... | 438/314 |

\* cited by examiner

*Primary Examiner* — Theresa T Doan
(74) *Attorney, Agent, or Firm* — Ingrassia Fisher & Lorenz, P.C.

(57) ABSTRACT

Integrated circuits with a Hall effect sensor and methods for fabricating such integrated circuits are provided. The method includes forming a buried plate layer within a substrate and overlying a substrate base, where the buried plate layer is doped with an "N" type dopant. A cover insulating layer if formed overlying the buried plate layer, and a plurality of contact points are formed adjacent to the cover insulating layer.

19 Claims, 5 Drawing Sheets

INTEGRATED CIRCUITS WITH HALL EFFECT SENSORS AND METHODS FOR PRODUCING SUCH INTEGRATED CIRCUITS

TECHNICAL FIELD

The technical field generally relates to integrated circuits and methods for producing integrated circuits, and more particularly relates to integrated circuits with Hall effect sensors and methods for producing such integrated circuits.

BACKGROUND

Hall effect sensors are used to detect and measure magnetic fields. Because electricity produces a magnetic field as it flows, Hall effect sensors can also be used to detect electrical currents. Motion or rates of rotation are sometimes measured using magnets positioned on a moving part with a Hall effect sensor positioned to detect the magnet as it moves past a fixed point. Hall effect sensors can also be used to determine the proximity of a known magnetic field, so certain distances can be measured. In operation, a current is induced across a Hall effect sensor plate, and that current is deflected when a magnetic flux passes through the plate. The stronger the magnetic flux, the more the current is deflected, and the deflected current produces a voltage difference across the sensor plate perpendicular to the induced current. The strength of the magnetic field passing through the plate can be determined by measuring the voltage across the sensor plate, where the voltage is measured perpendicular to the induced current.

Several design features influence the sensitivity of Hall effect sensors, including the length of the Hall effect sensor plate, the carrier concentration of the sensor plate, and the thickness of the sensor plate. Sensitivity is increased by producing a longer plate, a lower carrier concentration, and/or a thinner plate. Hall effect sensors are often incorporated into integrated circuits. Increasing the sensitivity of Hall effect sensors can produce integrated circuits that sense a magnetic field more reliably, because smaller magnetic fields can be detected. More sensitive Hall effect sensors can detect and measure smaller changes in magnetism, so more accurate measurements are possible.

Accordingly, it is desirable to develop integrated circuits having Hall effect sensors with thinner sensor plates and greater sensitivity, and methods of producing the same. In addition, it is desirable to develop methods for producing Hall effect sensors that do not increase the number of manufacturing steps to help control production costs. Furthermore, other desirable features and characteristics of the present embodiment will become apparent from the subsequent detailed description and the appended claims, taken in conjunction with the accompanying drawings and this background.

BRIEF SUMMARY

Integrated circuits with a Hall effect sensor and methods for fabricating such integrated circuits are provided. In an exemplary embodiment, a method is provided for producing an integrated circuit. The method includes forming a buried plate layer within a substrate and overlying a substrate base, where the buried plate layer is doped with an "N" type dopant. A cover insulating layer is formed overlying the buried plate layer, and a plurality of contact points are formed adjacent to the cover insulating layer.

In another exemplary embodiment, a method for fabricating an integrated circuit includes forming a buried plate layer within a substrate and overlying a substrate base, where the buried plate layer includes an "N" type dopant. A second cover layer is formed overlying the buried plate layer, wherein the second cover layer includes a "P" type dopant. A first cover layer is formed overlying the second cover layer so the second cover layer is between the first cover layer and the buried plate layer, where the first cover layer includes "P" type dopant. A plurality of contact points are formed on four different sides of the first cover layer.

In a further exemplary embodiment, an integrated circuit includes a substrate with a substrate base. A buried plate layer overlies the substrate base, where the buried plate layer includes a semiconductor material doped with an "N" type dopant. A first cover layer overlies the buried plate layer, where the first cover layer includes a semiconductor material doped with a "P" type dopant at a first dopant concentration. A second cover layer overlies the buried plate layer and underlies the first cover layer, where the second cover layer includes a semiconductor material doped with "P" type dopant at a second dopant concentration less than the first dopant concentration. A plurality of contact points are adjacent to the first cover layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the application and uses of the embodiment described. Furthermore, there is no intention to be bound by any theory presented in the preceding background or the following detailed description.

Many integrated circuits include Hall effect sensors for detecting magnetic fields. The sensitivity of the Hall effect sensor increases as the thickness of the Hall effect plate is decreased. The Hall effect plate, referred to herein as a buried plate layer, is formed from a semiconductor doped with "N" type dopants. The buried plate layer is positioned under a cover layer and over a substrate base, and several different embodiments of the cover layer are possible. In one embodiment, the cover layer is an insulating material that may be a shallow trench isolation formed while other shallow trench isolations are produced for the integrated circuit. In other embodiments, the insulating material is formed overlying the buried plate layer, and the depth of the insulating material is adjusted to give the desired buried plate layer thickness. In yet other embodiments, the cover layer is a semiconductor material doped with "P" type dopants instead of an insulating material. Different embodiments can be used to decrease the thickness of the buried plate layer when using a semiconductor cover layer doped with "P" type dopants. In one embodiment, a buried insulating layer is formed underlying the buried plate layer and overlying the substrate base. In another embodiment, the thickness of the cover layer is increased by forming a second cover layer that extends under the first cover layer. Contact points are formed on four different sides of the cover layer, where the contact points include "N" type dopants. An optional conductive zone can be formed underlying the contact points, where the conductive zone is doped with "N" type dopants at a lower concentration than in the contact points. The various doped layers or components of the Hall effect sensor have dopant concentrations about the same as the dopant concentrations in other components in the integrated circuit. Therefore, in accordance with the embodiments presented herein, many or all of the doped components of the Hall effect sensor are formed while producing other components in the integrated circuit, so there are very few or no extra manufacturing steps to produce the Hall effect sensor.

Figure 1:
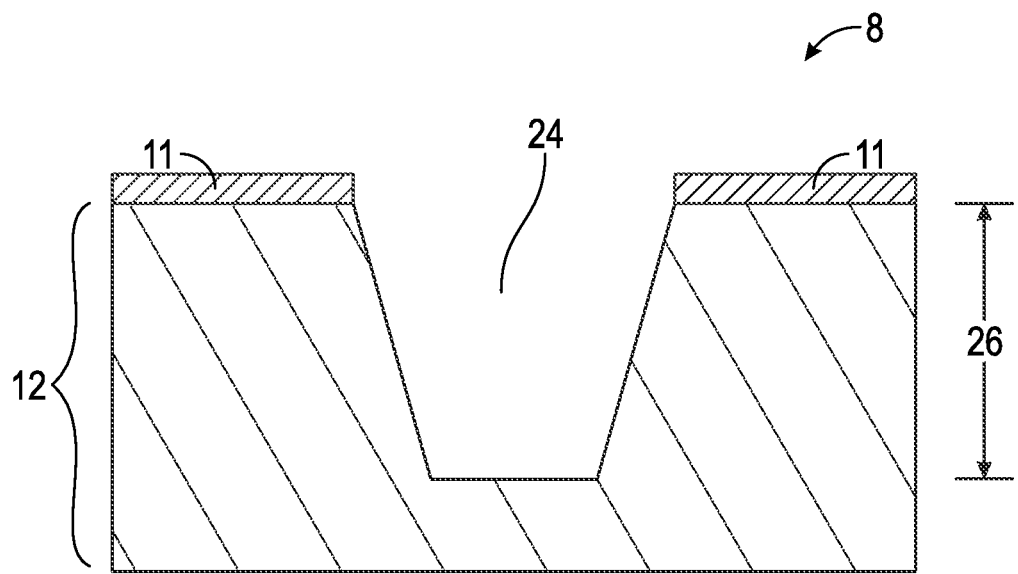
FIGS. 1-4 and 6-9 illustrate, in cross sectional views, a portion of an integrated circuit with a Hall effect sensor and methods for its fabrication in accordance with exemplary embodiments.
Figure 2:
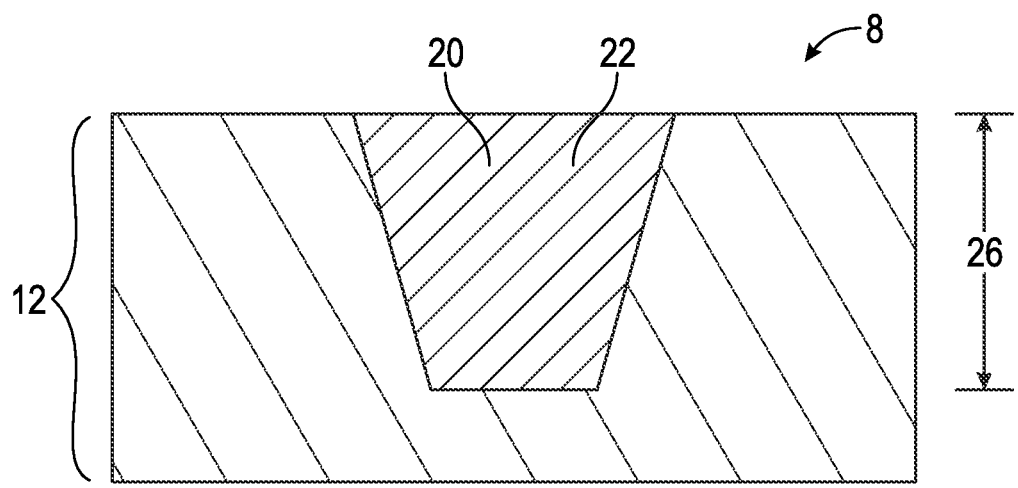

Reference is made to FIGS. 1 and 2. In some embodiments, an early step in the manufacture of an integrated circuit 8 is the production of a cover insulating layer 20 in a substrate 12. The cover insulating layer 20 is one embodiment of a cover described below, but other types of covers are also possible. The substrate 12 is formed from a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the semiconductor material is a silicon substrate. The silicon substrate may be a bulk silicon wafer (as illustrated) or may be a thin layer of silicon on an insulating layer (commonly known as silicon-on-insulator or SOI) that, in turn, is supported by a carrier wafer.

In some embodiments, the cover insulating layer 20 is a shallow trench isolation 22, but in other embodiments the cover insulating layer 20 is a separate structure. The cover insulating layer 20 is formed from an insulating material, such as silicon oxide, silicon nitride, or other insulating materials. FIGS. 1 and 2 illustrate embodiments where the cover insulating layer 20 is a shallow trench isolation 22. Forming the shallow trench isolation 22 may include etching a trench 24 in the substrate 12, such as with a reactive ion etch using carbon tetrachloride. An STI hard mask 11 and photoresist (not illustrated) may be used to protect selected areas of the substrate 12 while exposing desired areas for etching, as is understood by those skilled in the art. The STI hard mask 11 may be formed by oxidizing the surface of a silicon substrate and depositing silicon nitride overlying the silicon oxide and the substrate 12, but other types of STI hard mask 11 may also be used. As used herein, the term "overlying" means "over," such that an intervening layer may lie between the STI hard mask 11 and the substrate 12, and "on," such that the STI hard mask 11 may physically contact the substrate 12. In an exemplary embodiment, the silicon oxide of the STI hard mask 11 is formed by exposing a substrate 12 that includes silicon to an oxidizing ambient at elevated temperatures, and the silicon nitride is deposited by low pressure chemical vapor deposition using ammonia and dichlorosilane. As such, formation of the cover insulating layer 20 does not increase the number of manufacturing steps, and only requires modification of a photoresist mask used when forming other shallow trench isolations in the integrated circuit 8. Other hard masks and photoresist may also be used to expose selected areas for ion implantation or etching when producing other components in the integrated circuit 8, such as the N wells for PFETs, and details of the hard mask and photoresist layers are often left out of this description to prevent undue repetition.

In an exemplary embodiment, an insulating material is deposited in the trench 24 to form the cover insulating layer 20. For example, silicon oxide may be deposited in the trench 24 by a wide variety of methods, including chemical vapor deposition using silane and oxygen. The shallow trench isolation 22 typically extends into the substrate 12 about 0.2 to 0.4 microns, where the depth of the shallow trench isolation 22 or other cover insulating layer 20 is an insulating layer depth indicated by the double headed arrow 26. Silicon oxide overburden can then be removed by chemical mechanical planarization, and the silicon nitride portion of the STI hard mask 11 can be removed with an etchant selective to silicon nitride, such as hot phosphoric acid. The silicon oxide portion of the STI hard mark 11, if present, may be removed with an etchant selective to silicon oxide, such as a hydrofluoric acid solution buffered with ammonium fluoride, or it may be temporarily or permanently left in place.

In another embodiment, the cover insulating layer 20 is formed by etching the trench 24, filling it with an insulating material, and removing any overburden. This embodiment may modify the depth of the trench 24 by modifying the area being etched, and the trench 24 is filled at the same time and in the same process step as other shallow trench isolations in the integrated circuit 8. The resulting cover insulating layer 20 has an insulating layer depth 26 different than for other shallow trench isolations, even though it is formed at the same time as other shallow trench isolations without any additional process steps. Alternatively, a trench etching step separate from the shallow trench isolations can be used, so the depth of the trench 24 and the associated insulating layer depth 26 can be customized for a desired insulating layer depth 26. In this embodiment, the cover insulating layer 20 is formed separate from other shallow trench isolations in the integrated circuit 8. These embodiments provides a customized plate layer thickness 28 but may require extra manufacturing steps if a separate trench etching step is used.

Figure 3:
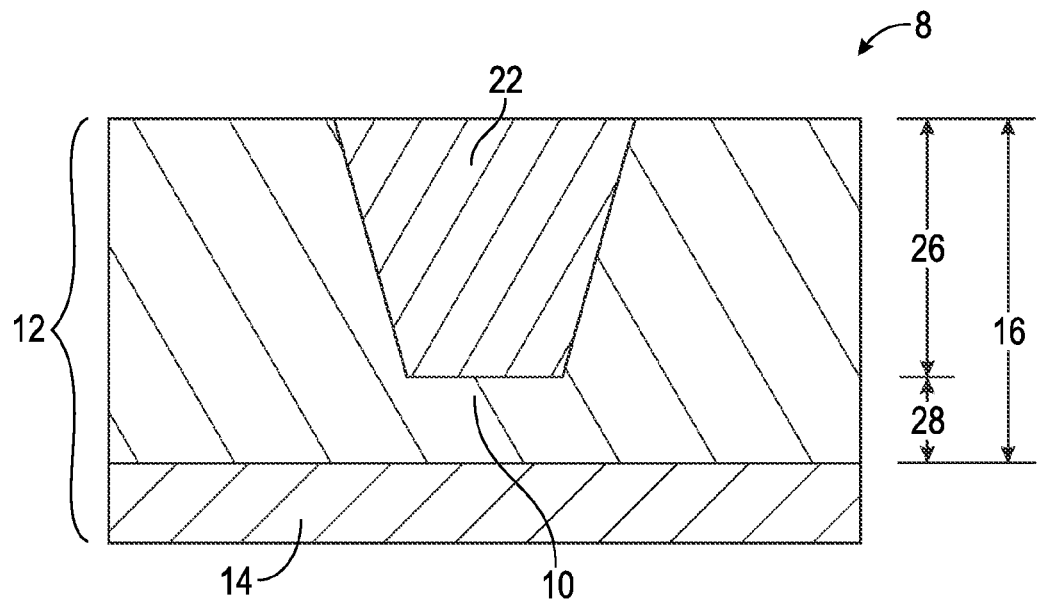

A buried plate layer 10 is formed in the substrate 12 underlying the cover insulating layer 20 and overlying a substrate base 14, as illustrated in FIG. 3. As such, the cover insulating layer 20 forms a cover overlying the buried plate layer 10. In an exemplary embodiment, the buried plate layer 10 is formed by implanting "N" type dopant ions into the substrate 12. The depth of the ion implantation for the buried plate layer 10 is a buried plate layer depth, indicated by the double headed arrow 16. The substrate base 14 is deeper within the substrate 12 than the buried plate layer depth 16. "N" type dopant ions are implanted into the substrate 12 under the influence of an electrical field in ion implantation. Dopant ions implanted into the insulating material of the shallow trench isolation 22 or other cover insulating layer 20 do not significantly impair the insulating properties of the insulating material. "N" type dopants include arsenic or phosphorous, but antimony, other materials, or combinations thereof can also be used, and different components may be implanted with the same or different "N" type dopants in various embodiments. The "N" type dopants in the buried plate layer 10 are implanted at a concentration similar to the N wells used for PFETs (not illustrated), so the "N" type dopants may be implanted when the N wells for other PFETs in an integrated circuit 8 are formed. As such, the buried plate layer depth 16 is about the same as the depth of the N wells for PFETs.

A hard mask and photoresist (not illustrated) may be used to expose selected areas for ion implantation when forming the buried plate layer 10, and this hard mask and photoresist may be the same one used for forming other components in the integrated circuit 8, such as the N wells for PFETs. As such, formation of the buried plate layer 10 does not increase the number of manufacturing steps, and only requires modification of a photoresist mask used when forming the N wells. Typical dopant concentrations for the buried plate layer 10 are from about $10^{15}$ to about $10^{18}$ per cubic centimeter ($CM^{-3}$). The buried plate layer 10 and the N wells are annealed after implantation in some embodiments, such as by rapid thermal annealing at about 1,000 degrees centigrade (° C.) for about 5-30 seconds, but other annealing conditions may be used in other embodiments. The insulating layer depth 26 is less than the buried plate layer depth 16, and in many embodiments the difference is the plate layer thickness, indicated by the double headed arrows 28.

In an alternate embodiment, the buried plate layer 10 is epitaxially grown overlying the substrate base 14, where the buried plate layer 10 includes "N" type dopants as described above. The buried plate layer 10 is grown by vapor phase epitaxy using silicon tetrachloride and hydrogen gas in one embodiment, but other types of epitaxy can also be used, such as molecular beam epitaxy. Doping impurities of the desired type and concentration are added to the source gas during the epitaxial growth, so the buried plate layer 10 is formed with the desired dopant at the desired concentration. In epitaxy embodiments as well as the ion implantation embodiments discussed above, the dopant concentration in the buried plate layer 10 may be about the same as the dopant concentration in the N wells for PFETs. The epitaxial growth may be available as a purchased substrate in some embodiments. The shallow trench isolation formation described above is performed after epitaxial growth.

Figure 4:
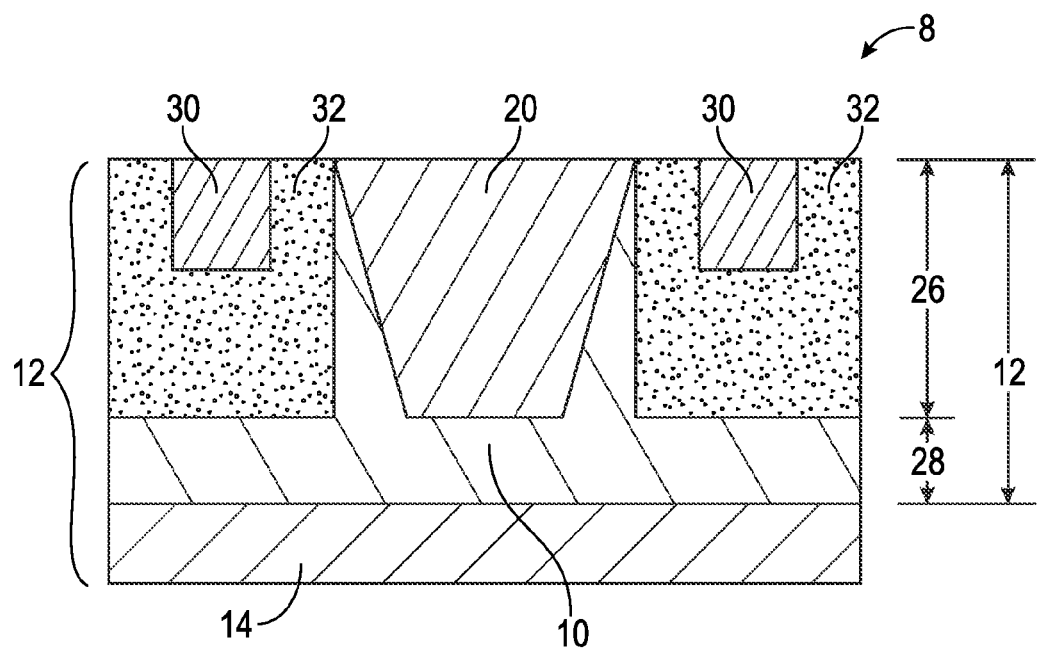

Referring to an alternative exemplary embodiment illustrated in FIG. 4, a cover insulating layer 20 is formed from the substrate 12. The cover insulating layer 20 includes an insulating material, such as silicon oxide, amorphous silicon, silicon nitride, or other insulating materials, such that the cover insulating layer 20 is an insulator. The cover insulating layer 20 illustrated in FIG. 4 can be formed with a desired insulating layer depth 26, so the plate layer thickness 28 can be customized. In an exemplary embodiment, ions are implanted into the substrate 12 at high doses, and the high doses of ions damage the crystalline structure of the substrate 12 to produce amorphous silicon that is an insulating material. The energy of the ion implantation can be adjusted to determine the insulating layer depth 26. In an alternate embodiment, oxygen ions are implanted into the substrate 12 at concentrations similar to that found in stoichiometric silicon oxide, where the substrate material includes crystalline silicon. The substrate 12 is annealed to create the cover insulating layer 20 by forming silicon oxide where the oxygen ions were implanted, such as by heating to about 1,300° C. for several hours. The energy used to implant the oxygen ions determines the depth of penetration, so the insulating layer depth 26 can be adjusted by controlling the energy used to implant the oxygen ions. A cover of insulating material may reduce leakage from the buried plate layer 10 in some embodiments, as compared to a cover of a conductive material, described below. As with other embodiments described above, the cover insulating layer 20 may be formed before the ion implantation used to form the buried plate layer 10.

Figure 5:
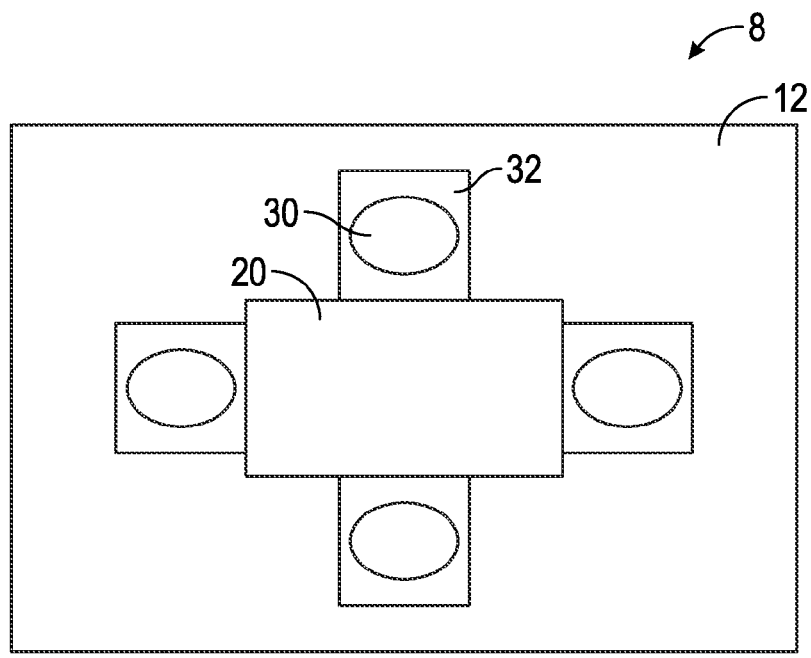
FIG. 5 illustrates a top view of an integrated circuit with a plurality of contact points.

A plurality of contact points 30 are adjacent to the cover insulating layer 20 and on four different sides of the cover insulating layer 20, as illustrated in the cross-sectional view in FIG. 4 and a top view in FIG. 5. The plurality of contact points 30 are formed adjacent to the cover insulating layer 20 for all embodiments, including the shallow trench isolation 22 or another cover insulating layer 20. In an exemplary embodiment, the contact points 30 are formed by implanting "N" type dopant ions on four opposite sides of the cover insulating layer 20 at a contact point dopant concentration. The contact points 30 are positioned such that a current can be induced through the buried plate layer 10 using two opposite contact points 30, and a voltage can be measured across the buried plate layer 10 through the remaining two contact points 30. The voltage is measured between two contact points 30 about perpendicular to the induced current flow between the other two contact points 30. As such, the contact points 30 are positioned as if adjacent to each of the sides of a square or rectangle, even though the cover insulating layer 20 may or may not be square or rectangular in shape. The contact points 30 may be formed by implanting "N" type dopant ions into the substrate 12, where the "N" type dopant ions are implanted at the contact point dopant concentration about the same as the source and drain for an NFET (not illustrated), or a source/drain concentration. In an exemplary embodiment, the "N" type dopant ions in the contact points 30 are at a contact point dopant concentration of about $10^{18}$ $cm^{-3}$ to about $10^{21}$ $cm^{-3}$. The contact points 30 may be formed at the same time as the source and drain for NFETs in the integrated circuit 8, so no additional manufacturing steps are required.

An optional conductive zone 32 may be formed by implanting "N" type dopant ions into the substrate 12 on four different sides of the cover insulating layer 20, where the conductive zone is electrically connected to the contact points 30. The "N" type dopants can be implanted at a conductive zone dopant concentration that is about the same concentration as a high voltage "N" type lowly doped drain or a high voltage "N" type double diffused drain used in other parts of the integrated circuit 8. In an exemplary embodiment, the conductive zone dopant concentration is about $10^{15}$ to about $10^{18}$ $cm^{-3}$. As such, the conductive zone 32 can be formed at the same time as the high voltage "N" type drains, and no extra manufacturing steps are required. The conductive zone 32 may extend deeper into the substrate 12 than the contact points 30, so there is less electrical resistance between the contact points 30 and the buried plate layer 10 underlying the cover. The contact points 30 described above may be implanted with "N" type dopant ions into the substrate 12 within the conductive zone 32 at a contact point dopant concentration greater than the conductive zone dopant concentration, so the contact points 30 are more electrically conductive than the conductive zone 32. In operation, the Hall effect sensor induces a current from one end of the buried plate layer 10 to an opposite end, and the voltage is measured across the buried plate layer 10 about perpendicular to the direction of the current. The conductive zone 32 can reduce the resistance for inducing a current through the buried plate layer 10, or for measuring the voltage across the buried plate layer 10, and may therefore lower the required voltage to induce the current and increase the voltage measurement sensitivity.

Figure 6:
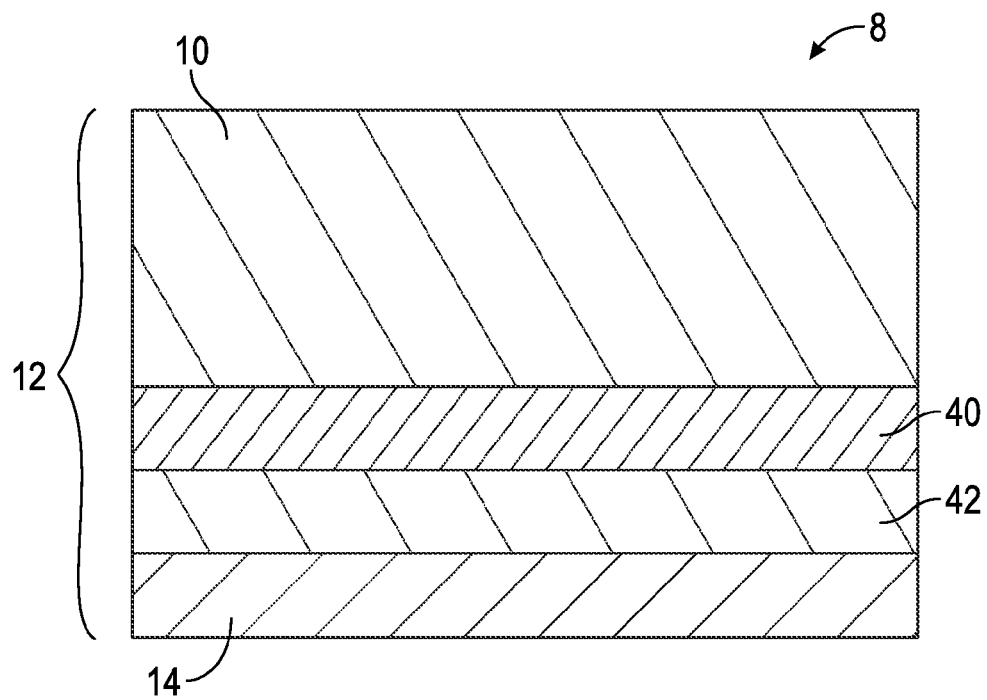

An alternate embodiment is illustrated in FIG. 6. In this embodiment, the buried plate layer 10 is formed as described above, but an insulating material is formed in a buried insulating layer 40 underlying the buried plate layer 10. There may be some doped semiconductor material 42 between the buried insulating layer 40 and the substrate base 14, but the buried insulating layer 40 blocks electrical conduction under the buried insulating layer 40 and therefore forms the bottom of the buried plate layer 10. The buried insulating layer 40 may be formed by implanting ions into the substrate 12 at high doses, and the high doses of ions damage the crystalline structure of the substrate 12 to produce amorphous silicon that is an insulating material. The ions can implanted such that the crystal structure of an overlying layer is not significantly damaged, so the buried insulating layer 40 is converted to amorphous silicon while the overlying buried plate layer 10 is not. For example, implanting high doses of silicon, germanium, or carbon ions at an energy of about 100 kiloelectron volts to about 10 megaelectron volts can produce an amorphous silicon buried insulating layer 40 from a crystalline silicon substrate 12. The depth of the buried insulating layer 40 can be adjusted by adjusting the implantation energy of the ions. The buried insulating layer 40 may be formed using other techniques in alternate embodiments, such as molecular or cluster implant methods.

In an alternate embodiment, oxygen ions are implanted into the substrate 12 at concentrations similar to that found in stoichiometric silicon oxide, where the substrate material includes crystalline silicon. The substrate 12 is annealed to create the buried insulating layer 40 by forming silicon oxide where the oxygen ions were implanted, such as by heating to about 1,300° C. for several hours. The energy used to implant the oxygen ions determines the depth of penetration, so the depth of the buried insulating layer 40 can be adjusted by controlling the energy used to implant the oxygen ions. As with the ions used to form the amorphous silicon, the oxygen ions can be implanted through a portion of the substrate 12 and deposited at the selected depth, so the buried plate layer 10 remains after the oxygen ions are implanted during formation of the buried insulating layer 40. In an exemplary embodiment, a buried insulating layer 40 is formed at depth of about 0.6 microns by implanting oxygen ions at an energy of about 200 kiloelectron volts to about 10 megaelectron volts.

Figure 7:
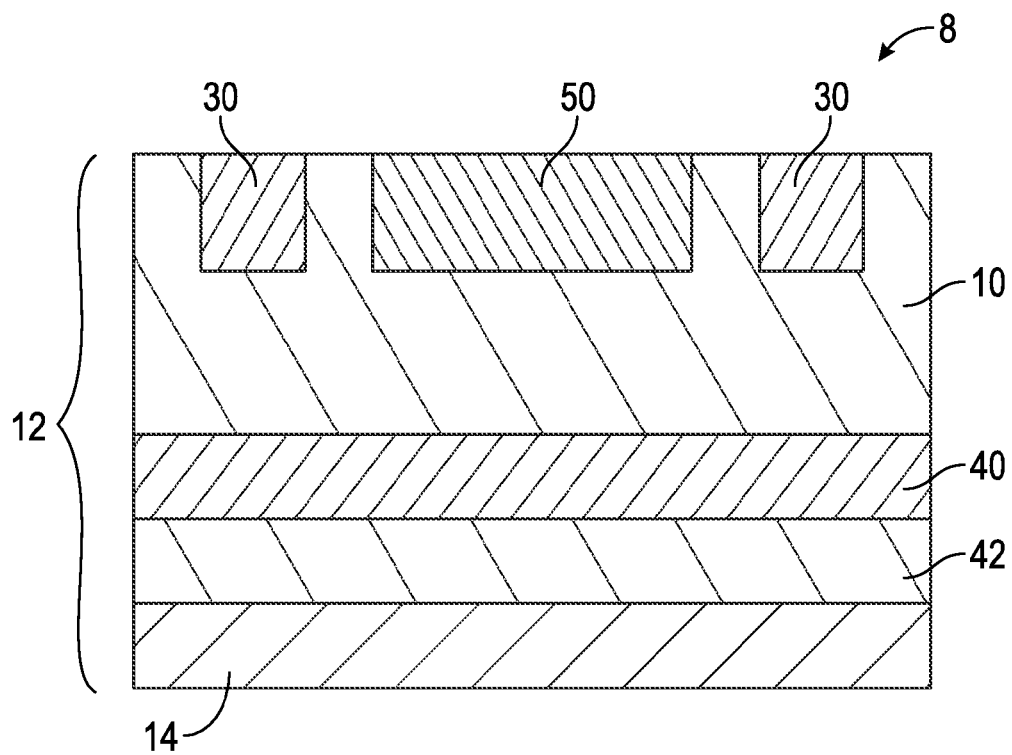

Reference is made to an exemplary embodiment illustrated in FIG. 7. A first cover layer 50 is formed overlying the buried plate layer 10, where the first cover layer includes "P" type dopants at a first dopant concentration about the same as the concentration of "P" type dopants in the source and drain of a PFET (not illustrated), or a source/drain concentration. "P" type dopants include boron, aluminum, gallium, and indium, but other materials or combinations of materials can also be used, and different components may be implanted with the same or different "P" type dopants in various embodiments. In an exemplary embodiment, the "P" type dopant ions in the first cover layer 50 are at the first dopant concentration of about $10^{18}$ cm$^{-3}$ to about $10^{21}$ cm$^{-3}$. As such, the first cover layer 50 can be formed at the same time as the source and drain for PFETs in the integrated circuit 8, and no additional manufacturing steps are required. Contact points 30 can then be formed on opposite sides of the first cover layer 50, as described above for the cover insulating layer. The first cover layer 50 may be used in conjunction with the buried insulating layer 40, so the plate layer thickness 28 extends from the bottom of the first cover layer 50 to the top of the buried insulating layer 40. In alternate embodiments, the buried plate layer 10 is doped with "P" type dopants, and the first cover layer 50 and second cover layer 52 (if present) are doped with "N" type dopants. These embodiments can use the process described above, except with alternate dopants.

Figure 8:
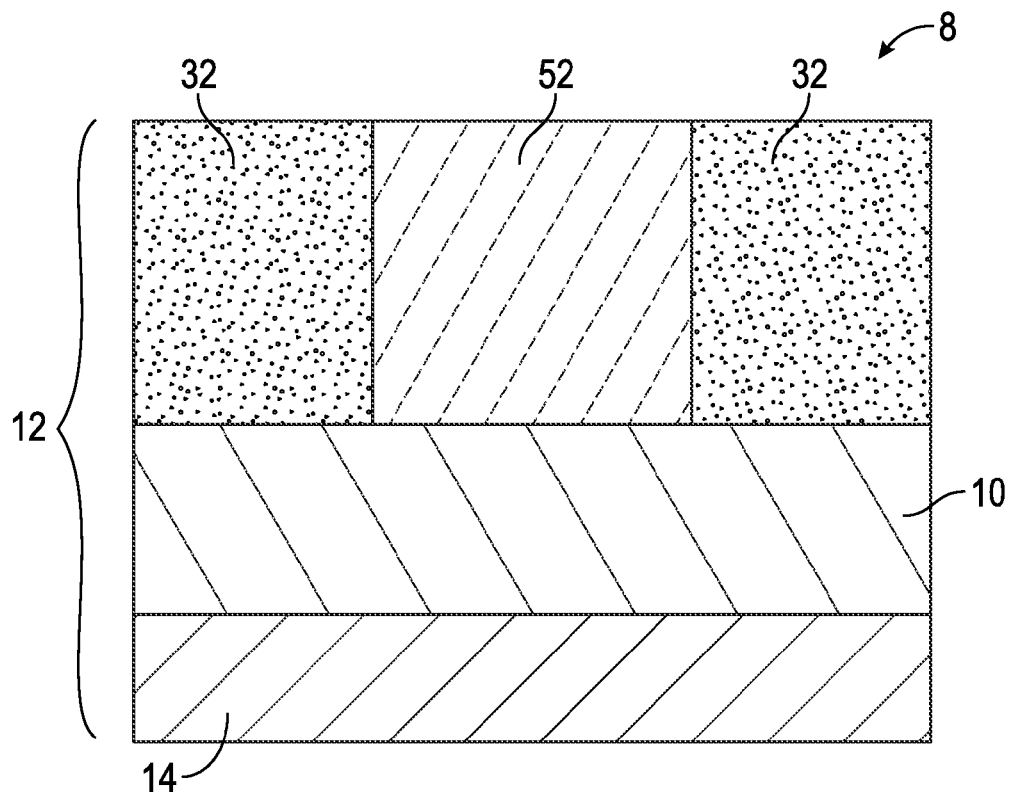

Another alternate embodiment is illustrated in FIG. 8. In this embodiment, the buried plate layer 10 is formed as described above, but no insulating layer need be present, either above or below the buried plate layer 10. However, an insulating layer may be added above and/or below the buried plate layer 10 in some embodiments. A second cover layer 52 is formed by implanting "P" type dopant ions into the substrate 12 overlying the buried plate layer 10. The "P" type dopants can be implanted at a second dopant concentration about the same as a high voltage "P" type lowly doped drain or a high voltage "P" type double diffused drain (not illustrated) included in other parts of the integrated circuit 8, such as a second dopant concentration of about $10^{15}$ to about $10^{18}$ cm$^{-3}$. As such, the second cover layer 52 can be formed at the same time as the high voltage "P" type drains, and no extra manufacturing steps are required. A plurality of conductive zones 32 may optionally be formed on opposite sides of the second cover layer 52, as described above.

Figure 9:
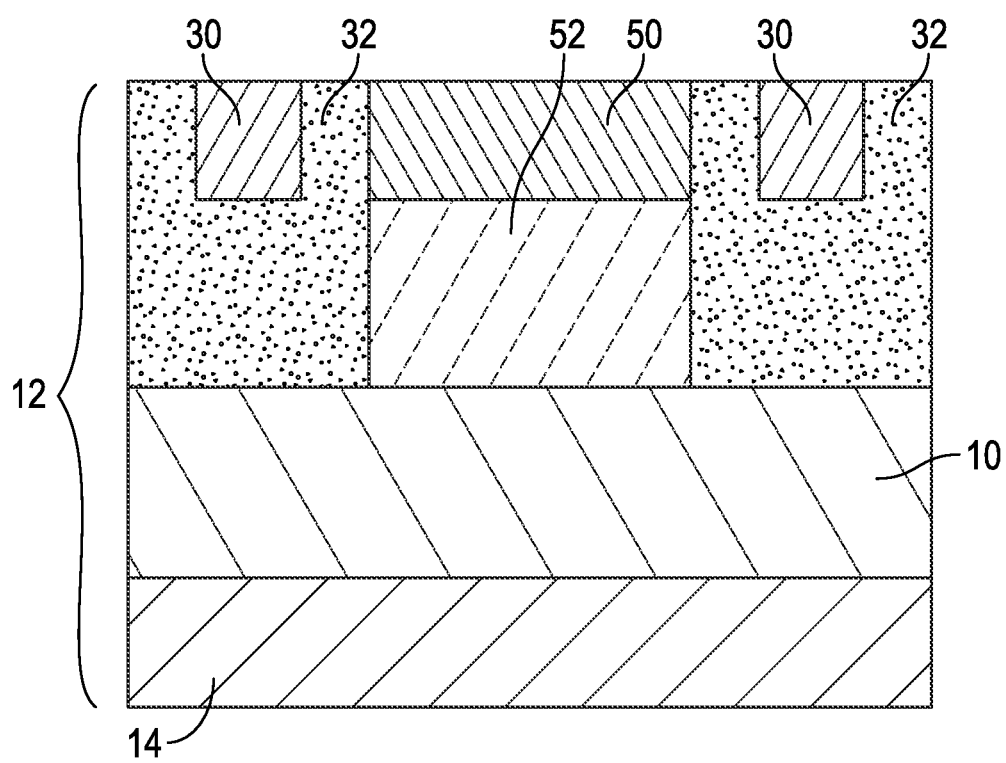

A first cover layer 50 may be formed overlying the second cover layer 52, as illustrated in FIG. 9. The first cover layer 50 is formed as described above, and the first cover layer 50 may include some ions implanted to form the second cover layer 52. The first dopant concentration in the first cover layer 50 is greater than the second dopant concentration in the second cover layer 52, often by orders of magnitude, so any additional ions from implanting the second cover layer 52 have very little effect on the first dopant concentration in the first cover layer 50. The second cover layer 52 extends deeper into the substrate 12 than the first cover layer 50, and the buried plate layer 10 is positioned between the second cover layer 52 and the substrate base 14. Therefore, the use of a second cover layer 52 reduces the plate layer thickness 28 and increases the sensitivity of the Hall effect sensor over a Hall effect sensor formed without the second cover layer 52. This can be seen in FIG. 9 because the second cover layer 52 extends further into the substrate 12 than the first cover layer 50, thus reducing the thickness of the buried plate layer 10 overlying the substrate base 14. A plurality of contact points 30 are formed on opposites sides of the first cover layer 50, as described above. As mentioned above, many of the manufacturing steps are performed simultaneously with other manufacturing steps, so the Hall effect sensor can be produced with few if any additional manufacturing steps. The Hall effect sensor can be incorporated into the integrated circuit 8 using methods and techniques understood by those skilled in the art.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   forming a buried plate layer within a substrate and overlying a substrate base, wherein the buried plate layer is doped with an "N" type dopant;
   forming a cover insulating layer overlying the buried plate layer; and
   forming a plurality of contact points in the substrate, wherein the plurality of contact points are adjacent to the cover insulating layer, and wherein the plurality of contacts are on four different sides of the cover insulating layer.

2. The method of claim 1 wherein forming the cover insulating layer comprises forming a shallow trench isolation.

3. The method of claim 2 wherein forming the cover insulating layer comprises etching a trench in the substrate and depositing an insulating material in the trench to form the shallow trench isolation.

4. The method of claim 1 wherein forming the cover insulating layer comprises forming an amorphous silicon layer overlying the buried plate layer.

5. The method of claim 1 wherein forming the cover insulating layer comprises oxidizing the substrate to form silicon oxide, wherein the substrate comprises silicon.

6. The method of claim 1 wherein forming the plurality of contact points comprises forming the plurality of contact points adjacent to each of the sides of a square or a rectangle.

7. The method of claim 1 wherein forming the buried plate layer comprises epitaxially growing the substrate overlying the substrate base.

8. The method of claim 1 wherein forming the plurality of contact points comprises implanting "N" type dopant ions into the substrate.

9. The method of claim 1 wherein forming the plurality of contact points comprises:
   implanting "N" type dopant ions into the substrate at a conductive zone dopant concentration to form a conductive zone; and
   implanting "N" type dopant ions into the conductive zone at a contact point dopant concentration greater than the conductive zone dopant concentration to form the plurality of contact points.

10. The method of claim 1 wherein forming the plurality of contact points comprises forming the plurality of contact points by implanting "N" type dopant ions at a source/drain concentration.

11. A method of producing an integrated circuit comprising:
   forming a buried plate layer within a substrate and overlying a substrate base, wherein the buried plate layer comprises an "N" type dopant;
   forming a second cover layer overlying the buried plate layer, wherein the second cover layer comprises a "P" type dopant;
   forming a first cover layer overlying the second cover layer such that the second cover layer is positioned between the first cover layer and the buried plate layer, and wherein the first cover layer comprises "P" type dopant; and
   forming a plurality of contact points on four different sides of the first cover layer.

12. The method of claim 11 wherein forming the buried plate layer comprises implanting "N" type dopant ions into the substrate.

13. The method of claim 11 wherein forming the buried plate layer comprises epitaxially growing the buried plate layer overlying the substrate base.

14. The method of claim 11 wherein forming the plurality of contact points comprises implanting "N" type dopant ions into the substrate.

15. The method of claim 11 wherein forming the plurality of contact points comprises:
   implanting "N" type dopant ions into the substrate at a conductive zone dopant concentration to form a conductive zone; and
   implanting "N" type dopant ions into the conductive zone at a contact point dopant concentration greater than the conductive zone dopant concentration to form the plurality of contact points.

16. The method of claim 11 wherein forming the second cover layer comprises forming the second cover layer with "P" type dopant ions at a second dopant concentration; and wherein
   forming the first cover layer comprises forming the first cover layer with "P" type dopant ions at a first dopant concentration, wherein the first dopant concentration is greater than the second dopant concentration.

17. The method of claim 16 wherein forming the second cover layer comprises forming the second cover layer wherein the second dopant concentration is about the same as a dopant concentration in a high voltage "P" type lowly doped drain; and wherein
   forming the first cover layer comprises forming the first cover layer wherein the first dopant concentration is about the same as a source/drain concentration.

18. The method of claim 11 wherein forming the first cover layer comprises implanting "P" type dopant ions at about a source/drain concentration.

19. The method of claim 11 where forming the plurality of contact points comprises forming the plurality of contact points adjacent to each of the sides of a square or a rectangle.

\* \* \* \* \*